(12) United States Patent
Hwang et al.

(10) Patent No.: US 12,428,347 B2
(45) Date of Patent: Sep. 30, 2025

(54) CERAMIC COMPONENT AND PLASMA ETCHING APPARATUS COMPRISING SAME

(71) Applicant: Solmics Co., Ltd., Pyeongtaek-si (KR)

(72) Inventors: SurgSic Hwang, Seoul (KR); Junrok Oh, Seoul (KR); Kyungyeol Min, Yongin-si (KR); Kyungin Kim, Hwaseong-si (KR); Jungkun Kang, Pyeongtaek-si (KR); Younguk Han, Pyeongtaek-si (KR)

(73) Assignee: Solmics Co., Ltd., Pyeongtaek-si (KR)

( * ) Notice: Subject to any disclaimer, the term of this patent is extended or adjusted under 35 U.S.C. 154(b) by 711 days.

(21) Appl. No.: 17/884,926

(22) Filed: Aug. 10, 2022

(65) Prior Publication Data

US 2022/0380263 A1   Dec. 1, 2022

Related U.S. Application Data

(63) Continuation of application No. PCT/KR2021/001730, filed on Feb. 9, 2021.

(30) Foreign Application Priority Data

Feb. 12, 2020   (KR) .................. 10-2020-0017254
Dec. 2, 2020    (KR) .................. 10-2020-0166396

(51) Int. Cl.
*C04B 35/563*   (2006.01)
*C04B 35/626*   (2006.01)
(Continued)

(52) U.S. Cl.
CPC ........ *C04B 35/563* (2013.01); *C04B 35/6261* (2013.01); *C04B 41/5027* (2013.01);
(Continued)

(58) Field of Classification Search
None
See application file for complete search history.

(56) References Cited

U.S. PATENT DOCUMENTS

2003/0198749 A1   10/2003   Kumar et al.
2009/0151870 A1    6/2009   Urakawa et al.
2019/0352234 A1   11/2019   Chandrashekhar et al.

FOREIGN PATENT DOCUMENTS

CN   105294105 A   2/2016
CN   106380201 A   2/2017
(Continued)

OTHER PUBLICATIONS

International Search Report issued on May 27, 2021 in counterpart Patent Application No. PCT/KR2021/001730 (2 pages in English, 3 pages in Korean).
(Continued)

*Primary Examiner* — Jeffrey D Washville
(74) *Attorney, Agent, or Firm* — NSIP Law

(57) ABSTRACT

A ceramic component included in a plasma etching apparatus, wherein a surface of the ceramic component may include a base material and a composite material disposed in contact with the base material, wherein a resistivity of the ceramic component may be $10^{-1}$ Ω·cm to 20 Ω·cm, and wherein the base material may include a first boron carbide-based material and the composite material may include at least one selected from the group consisting of a second boron carbide-based material, a carbon-based material, and combinations thereof, is disclosed.

19 Claims, 16 Drawing Sheets

(51) Int. Cl.
*C04B 41/50* (2006.01)
*C04B 41/87* (2006.01)
*H01J 37/32* (2006.01)
*H01L 21/3065* (2006.01)

(52) U.S. Cl.
CPC .......... *C04B 41/5058* (2013.01); *C04B 41/87* (2013.01); *H01J 37/32642* (2013.01); *H01L 21/3065* (2013.01); *C04B 2235/3821* (2013.01); *C04B 2235/5436* (2013.01)

(56) References Cited

FOREIGN PATENT DOCUMENTS

| | | | |
|---|---|---|---|
| CN | 108409328 | A | 8/2018 |
| JP | 8-91933 | A | 4/1996 |
| JP | 2000-154062 | A | 6/2000 |
| JP | 2000-195844 | A | 7/2000 |
| JP | 2001-261429 | A | 9/2001 |
| JP | 2001-261457 | A | 9/2001 |
| JP | 2003-277168 | A | 10/2003 |
| JP | 2008-133160 | A | 6/2008 |
| JP | 2008-297134 | A | 12/2008 |
| JP | 4570195 | B2 | 10/2010 |
| JP | 2010-265154 | A | 11/2010 |
| JP | 2011-507274 | A | 3/2011 |
| JP | 2022-532665 | A | 7/2022 |
| KR | 10-1998-0063542 | A | 10/1998 |
| KR | 10-2006-0106865 | A | 10/2006 |
| KR | 10-0639888 | B1 | 10/2006 |
| KR | 10-2010-0099219 | A | 9/2010 |
| KR | 10-1101244 | B1 | 1/2012 |
| KR | 10-1592124 | B1 | 2/2016 |
| KR | 10-1628689 | B1 | 6/2016 |
| KR | 10-2018-0093814 | A | 8/2018 |
| KR | 10-2018-0117275 | A | 10/2018 |
| KR | 10-2020-0020764 | A | 2/2020 |
| KR | 10-2020-0032060 | A | 3/2020 |
| KR | 10-2104158 | B1 | 4/2020 |
| KR | 10-2128595 | B1 | 7/2020 |
| TW | 373228 | B | 11/1999 |
| TW | 201726947 | A | 8/2017 |
| WO | WO 03/089386 | A1 | 10/2003 |
| WO | WO 2009/079285 | A1 | 6/2009 |
| WO | WO 2009/106942 | A1 | 9/2009 |
| WO | WO 2014/132445 | A1 | 9/2014 |
| WO | WO 2016/052406 | A1 | 4/2016 |
| WO | WO 2019/156296 | A1 | 8/2019 |

OTHER PUBLICATIONS

International Written Opinion issued on May 27, 2021 in counterpart Patent Application No. PCT/KR2021/001730 (3 pages in Korean).
"Production of Carbon and Graphite Products," Metallurgical Industry Press, Version 1, Jun. 1976, (3 Pages in Chinese, 3 Pages in English).
Lizhai, Pei "High-Tech Ceramic Materials," Hefei: Hefei University of Technology Press, 2015, (3 Pages in Chinese, 3 Pages in English).
Bhat, G "Structure and Properties of High-Performance Fibers," Beijing: China Textile & Apparel Press, 2020, (3 Pages in Chinese, 3 Pages in English).
Sun Dayong, et al. "Advanced Manufacturing Technology" China Machine Press, Feb. 2000, (3 pages in Chinese, 4 pages in English).
Cheng, Chun, et al., "Structure and Mechanical Properties of Boron-Rich Boron Carbides", Journal of the European Ceramic Society, Jun. 21, 2017, (p. 4514-4523).

CERAMIC COMPONENT AND PLASMA ETCHING APPARATUS COMPRISING SAME

CROSS-REFERENCE TO RELATED APPLICATIONS

Pursuant to 35 USC 120 and 365(c), this application is a continuation of International Application No. PCT/KR2021/001730 filed on Feb. 9, 2021, and claims the benefit under 35 USC 119(a) of Korean Application No. 10-2020-0017254 filed on Feb. 12, 2020 and Korean Application No. 10-2020-0166396 filed on Dec. 2, 2020, in the Korean Intellectual Property Office, the entire disclosures of which are incorporated herein by reference for all purposes.

BACKGROUND

1. Field

The present disclosure relates to a ceramic component and a plasma etching apparatus including the same.

2. Description of the Background

A plasma processing apparatus applies an electric power to both of upper and lower electrodes, by disposing the upper electrode and the lower electrode inside a chamber and placing a semiconductor wafer and a substrate such as a glass substrate on the lower electrode. Electrons accelerated by an electric field between both of the electrodes, electrons emitted from the electrodes, or heated electrons cause ionization collision with molecules from a processing gas, and as a result, plasma of the processing gas is produced. Reactive species such as radicals or ions in plasma perform a desired micromachining process, for example, an etching process, on a surface of the substrate. Recently, a designing rule is being increasingly detailed, particularly, in a plasma etching, further high measurement accuracy is being demanded, and therefore, a remarkably higher electric power than a conventional electric power is being used. Such a plasma processing apparatus includes a focus ring, which is affected by the plasma. The focus ring is also referred to as an edge ring, a cold ring, or the like.

In a case of the focus ring, when an electric power is higher, due to a wavelength effect, in which a standing wave occurs, and a skin effect, in which an electric field is concentrated on the center of the surface of the electrode, and the like, mostly the plasma is maximized in the center portion and the lowest in the edge portion, and therefore nonuniformity of the distribution of the plasma on the substrate is intensified. When the distribution of plasma on the surface is not uniform, plasma processing cannot be performed consistently, and quality of minute electron elements are degraded.

Accordingly, there is a need of securing a high functional focus ring to improve the yield rate of the minute electron elements including a wafer.

The background art described herein is technical information acquired by the inventor for derivation of an embodiment or acquired during the derivation process, and is not necessarily a prior art disclosed to general public before filing of the present disclosure.

SUMMARY

In a general aspect, the ceramic component according to an embodiment may be a ceramic component included in a plasma etching apparatus, wherein a surface of the ceramic component may include a base material and a composite material disposed in contact with the base material, wherein a resistivity of the ceramic component may be $10^{-1}$ Ω·cm to 20 Ω·cm, and wherein the base material may include a first boron carbide-based material and the composite material may include at least one selected from the group consisting of a second boron carbide-based material, a carbon-based material, and combinations thereof.

A size of the composite material may be 40 μm or less.

The second boron carbide-based material of the composite material may have an $I_{ab}/I_{cd}$ ratio of 1.0 to 1.8, where the $I_{ab}/I_{cd}$ ratio is a ratio of a sum ($I_{ab}$) of strengths of peaks near 481 $cm^{-1}$ ($I_a$) and strengths of peaks near 534 $cm^{-1}$ ($I_b$) to a sum ($I_{cd}$) of strengths of peaks near 270 $cm^{-1}$ ($I_c$) and strengths of peaks near 320 $cm^{-1}$ ($I_d$), in a Raman shift spectrum measured through Raman spectroscopy.

The carbon-based material of the composite material may have an $I_e/I_f$ ratio of 0.2 to 2, where the $I_e/I_f$ ratio is a ratio of a strength of G band peak ($I_e$) to a strength of D band peak ($I_f$), in the Raman shift spectrum.

The $I_{ab}/I_{cd}$ ratio may be 1.1 to 2.3.

The ceramic component may include a plurality of pores at the surface or in a section thereof and an average diameter of the plurality of pores may be 5 μm or less.

The ceramic component may include: a placing part having a first height from a reference plane; and a main part having a second height from the reference plane, wherein the placing part may include an upper surface of the placing part where an etching target is placed, and the main part may include an upper surface of the main part, which is directly etched by plasma.

A gradient part may be further included between the placing part and the main part, and the gradient part may include an upper surface of the gradient part connecting the upper surface of the placing part and the upper surface of the main part.

The ceramic component may have a bending strength of 300 MPa or more.

A total amount of the carbon-based material may be 0.5 wt % or more based on a total weight of the ceramic component.

In another general aspect, the ceramic component according to another embodiment may be a ceramic component included in a plasma etching apparatus, wherein a surface of the ceramic component may include a base material and a composite material disposed in contact with the base material, wherein a resistivity of the ceramic component may be $10^{-2}$ Ω·cm to $10^{-1}$ Ω·cm, and wherein the base material may include a first boron carbide-based material and the composite material may include at least one selected from the group consisting of a second boron carbide-based material, boron oxide, and combinations thereof.

A size of the composite material may be 40 μm or less.

The second boron carbide-based material of the composite may have an $I_{ab}/I_{cd}$ ratio of 1 to 1.8, where a ratio of a sum ($I_{ab}$) of strengths of peaks near 481 $cm^{-1}$ ($I_a$) and strengths of peaks near 534 $cm^{-1}$ ($I_b$) to a sum ($I_{cd}$) of strengths of peaks near 270 $cm^{-1}$ ($I_c$) and strengths of peaks near 320 $cm^{-1}$ ($I_d$), in a Raman shift spectrum measured through Raman spectroscopy.

The $I_{ab}/I_{cd}$ ratio may be 1.1 to 2.3.

In another general aspect, the method of manufacturing a ceramic component according to an embodiment may include: preparing at least one raw material selected from the group consisting of a first raw material including boron carbide, a second raw material including boron carbide, boron oxide, and a carbon-based material, and a third raw material including boron carbide and a carbon-based material; and preparing the ceramic component by sintering and shaping machining the at least one raw material.

The preparing the at least one raw material may include preparing raw material grains by slurrying and granulating the at least one raw material.

The at least one raw material after the slurrying may have a zeta potential of +15 mV or more.

In another general aspect, the plasma etching apparatus according to the present disclosure may include the ceramic component described above.

Other features and aspects will be apparent from the following detailed description, the drawings, and the claims.

BRIEF DESCRIPTION OF THE DRAWINGS

Throughout the drawings and the detailed description, the same reference numerals refer to the same or like elements. The drawings may not be to scale, and the relative size, proportions, and depiction of elements in the drawings may be exaggerated for clarity, illustration, and convenience.

DETAILED DESCRIPTION OF EXEMPLARY EMBODIMENTS

Figure 1:
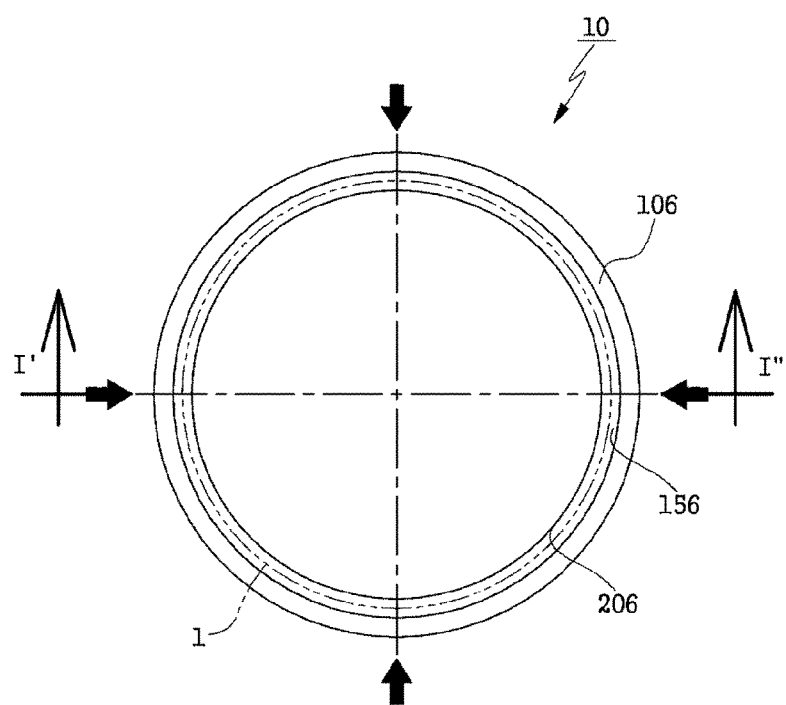
FIG. 1 is a schematic drawing for illustrating the ceramic component according to an embodiment viewed at an upper position (the arrows indicate measuring spots).

Hereinafter, example embodiments of the present disclosure will be described in detail with reference to the accompanying drawings so that they can be easily practiced by those skilled in the art to which the present disclosure pertains. However, the example embodiments may be embodied in many different forms and is not to be construed as being limited to the embodiments set forth herein. Like reference numerals designate like elements throughout the disclosure.

In this disclosure, the phrase that a certain element "comprises" or "includes" another element means that the certain element may further include one or more other elements but does not preclude the presence or addition of one or more other elements, unless stated to the contrary.

In this disclosure, when an element is referred to as being "connected" to another element, it can be understood not only as a case of a certain element directly connected to the other element but also as a case of having other elements interposed therebetween.

In this disclosure, "B being placed on A" means that B is placed in direct contact with A or placed over A with another layer or structure interposed therebetween and thus should not be interpreted as being limited to B being placed in direct contact with A.

In this disclosure, the phrase "combination(s) thereof" included in a Markush-type expression denotes one or more mixtures or combinations selected from the group consisting of components stated in the Markush-type expression, that is, denotes one or more components selected from the group consisting of the components are included.

In this disclosure, the description of "A and/or B" means "A, B, or A and B."

Throughout this disclosure, terms such as "first", "second", "A", or "B" are used to distinguish the same terms from each other unless specially stated otherwise.

In this disclosure, a singular form is contextually interpreted as including a plural form as well as a singular form unless specially stated otherwise.

One objective of the present disclosure is to provide a focus ring, which is a ceramic component having further improved properties.

Another objective of the present disclosure is to apply a focus ring, which is a ceramic component having further improved properties, and thereby to provide a method for more efficiently manufacturing a semiconductor element.

The ceramic component according to the present disclosure has advantages in the excellent properties such as etching resistance and impact resistance.

The ceramic component according to the present disclosure may include a composite material and a base material filled in contact with the composite material, and the composite material and the base material may have a strength ratio of a specific frequency satisfying a certain range in a Raman spectrum, and thereby the ceramic component allows the base material and the composite material to be harmonious and can exhibit good mechanical properties.

Ceramic Component 10

In a general aspect, the ceramic component 10 according to an embodiment may be a ceramic component included in a plasma etching apparatus, wherein the surface of the ceramic component may include a base material and a composite material disposed in contact with the base material, wherein the resistivity of the ceramic component may be $10^{-2}$ Ω·cm to $10^{-1}$ Ω·cm, or $10^{-1}$ Ω·cm to 20 Ω·cm, and wherein the base material may include a first boron carbide-based material and the composite material may include at least one selected from the group consisting of a second boron carbide-based material, a carbon-based material, and combinations thereof.

The size of the composite material may be 40 μm or less,

The second boron carbide-based material of the composite material may have an $I_{ab}/I_{cd}$ ratio of 1.0 to 1.8, where the $I_{ab}/I_{cd}$ ratio is a ratio of a sum ($I_{ab}$) of strengths of peaks near 481 cm$^{-1}$ ($I_a$) and strengths of peaks near 534 cm$^{-1}$ ($I_b$) to a sum ($I_{cd}$) of strengths of peaks near 270 cm$^{-1}$ ($I_c$) and strengths of peaks near 320 cm$^{-1}$ ($I_d$), in a Raman shift spectrum measured through Raman spectroscopy.

Figure 2:
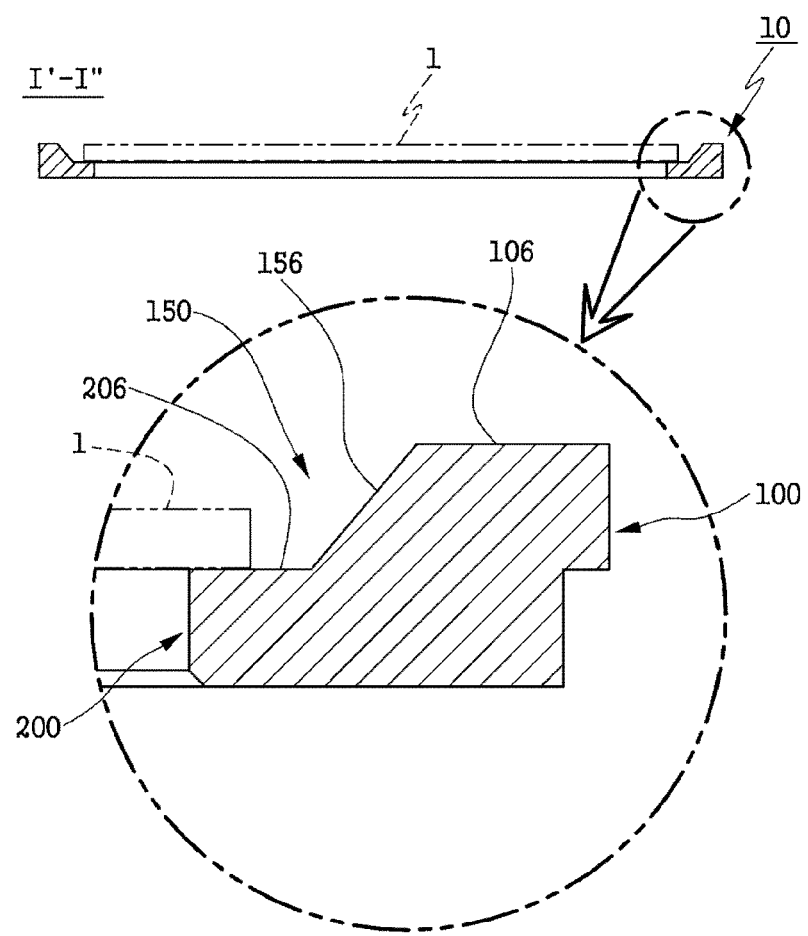
FIG. 2 is a schematic drawing for illustrating the section of the ceramic component according to an embodiment.

FIG. 1 is a plan view for one example of the ceramic component according to an embodiment, and FIG. 2 is a sectional view for one example of the ceramic component according to an embodiment. Hereinafter, the ceramic component will be described with reference to FIGS. 1 to 2.

The ceramic component 10 may be a focus ring included in a plasma etching apparatus 500.

Figure 5:
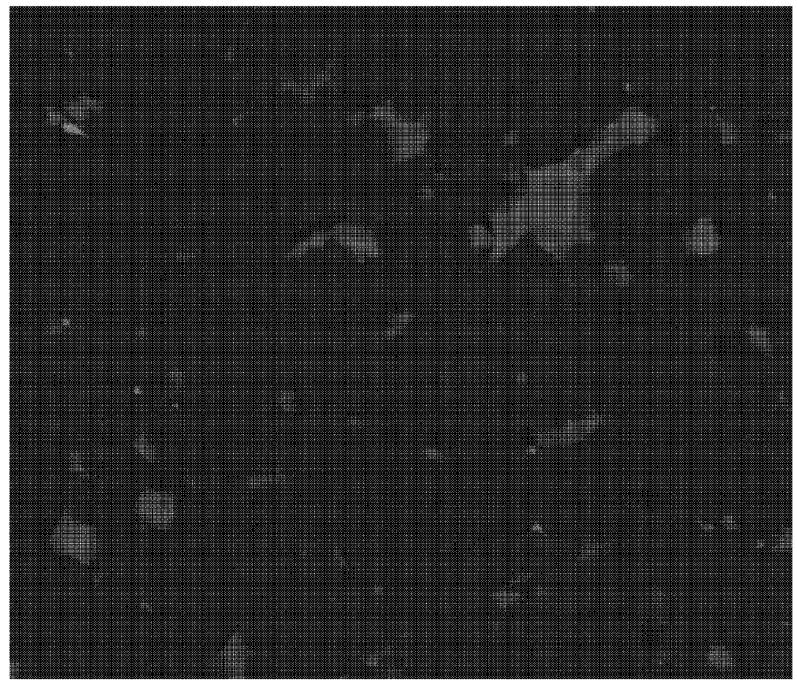
FIG. 5 is a photograph of the surface of the ceramic component according to an embodiment, obtained through Scanning Electron Microscope using Back Scattered Electron (BSE).
Figure 6:
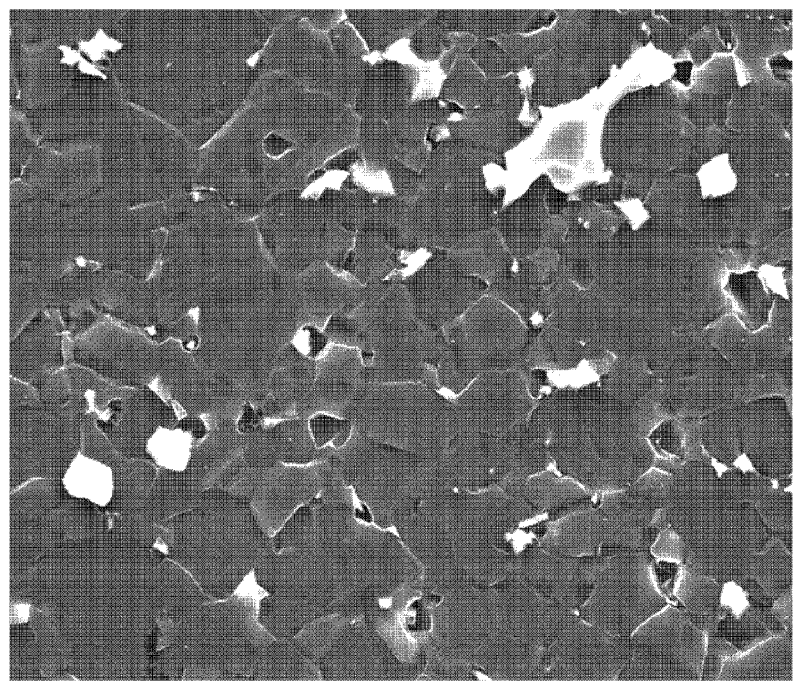
FIG. 6 is a photograph of the ceramic component according to an embodiment, obtained through Scanning Electron Microscope using Secondary Electron (SE).
Figure 7:
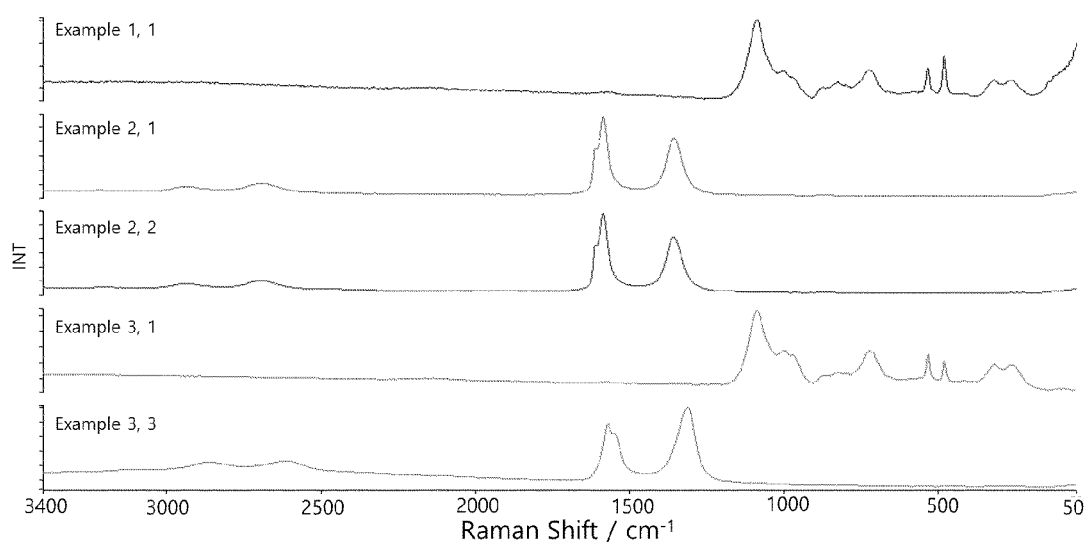
FIG. 7 is Raman shift spectrums according to Raman spectroscopy of the composite materials of Example 1 to Example 3 (from the top position, showing respectively Example 1, Example 2(1), Example 2(2), Example 3(1), and Example 3(3)).
Figure 8:
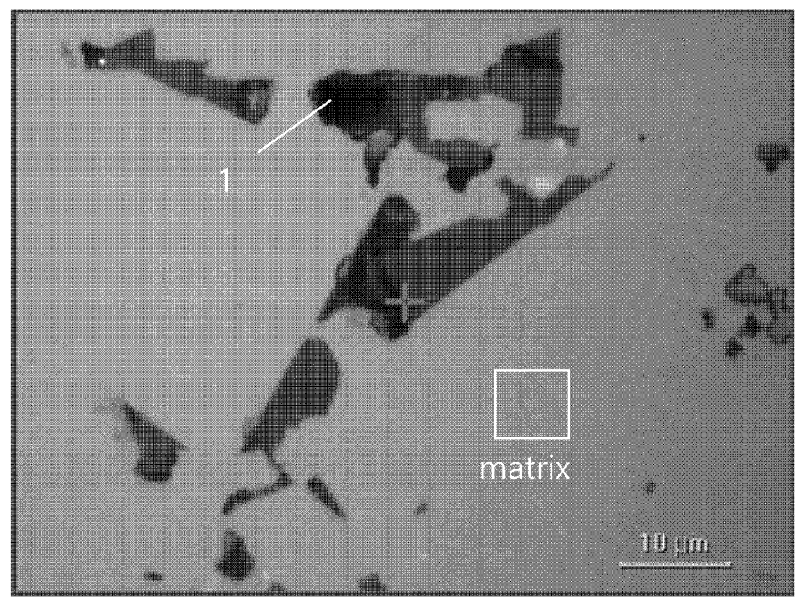
FIG. 8 is a sectional photograph of the sintered body of Example 1 (1: a composite material/matrix: a base material).
Figure 9:
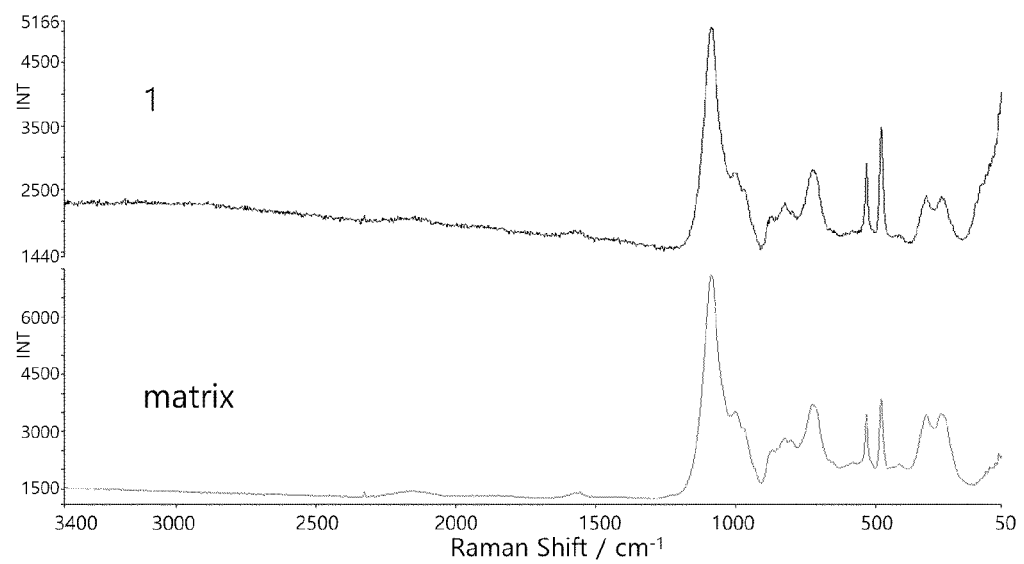
FIG. 9 is a Raman shift spectrum (1: a composite material/ matrix: a base material) according to Raman spectroscopy of Example 1.
Figure 10:
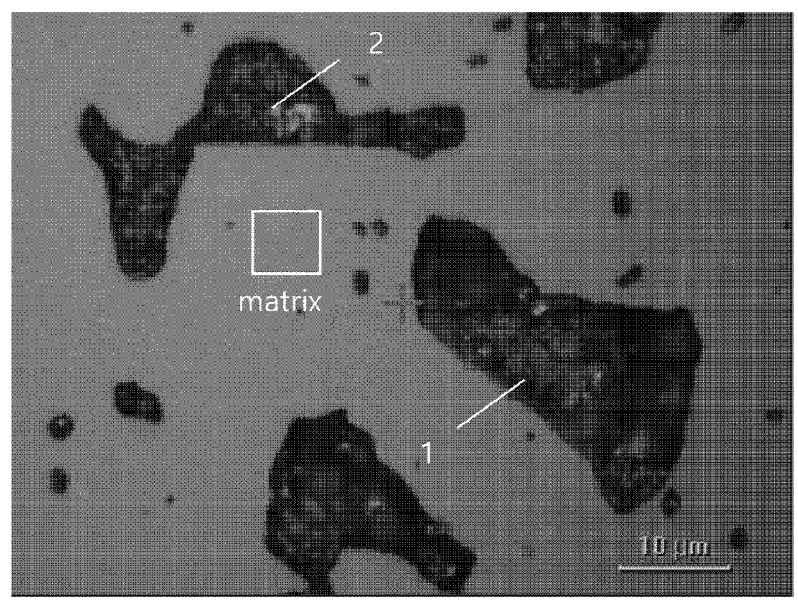
FIG. 10 is a sectional photograph (1 and 2: composite materials/matrix: a base material) of the sintering body of Example 2.
Figure 11:
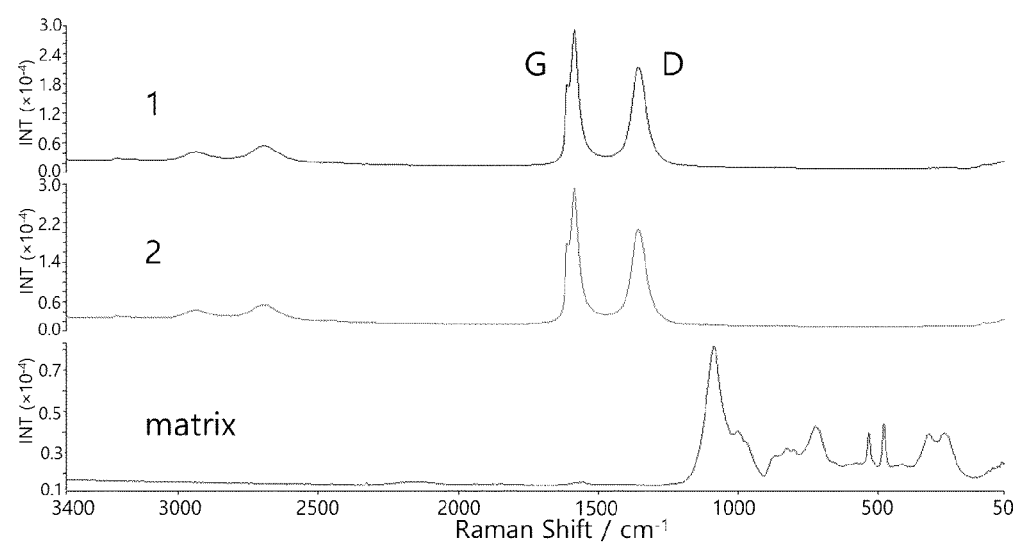
FIG. 11 is a Raman shift spectrum according to Raman spectroscopy of Example 2.
Figure 12:
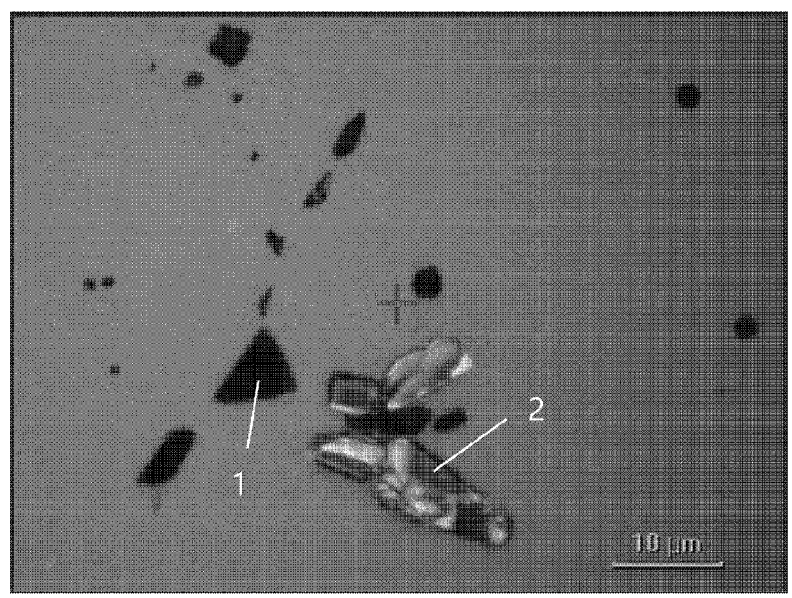
FIG. 12 is a sectional photograph (1 and 2: composite materials) of the sintered body of Example 3.
Figure 13:
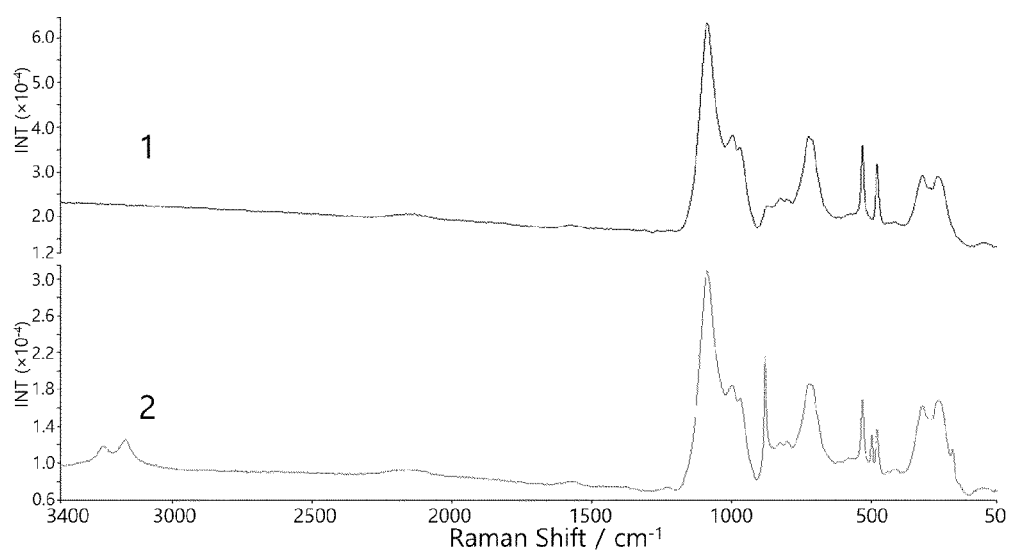
FIG. 13 is a Raman shift spectrum (1 and 2: composite materials) according to Raman spectroscopy of Example 3.
Figure 14:
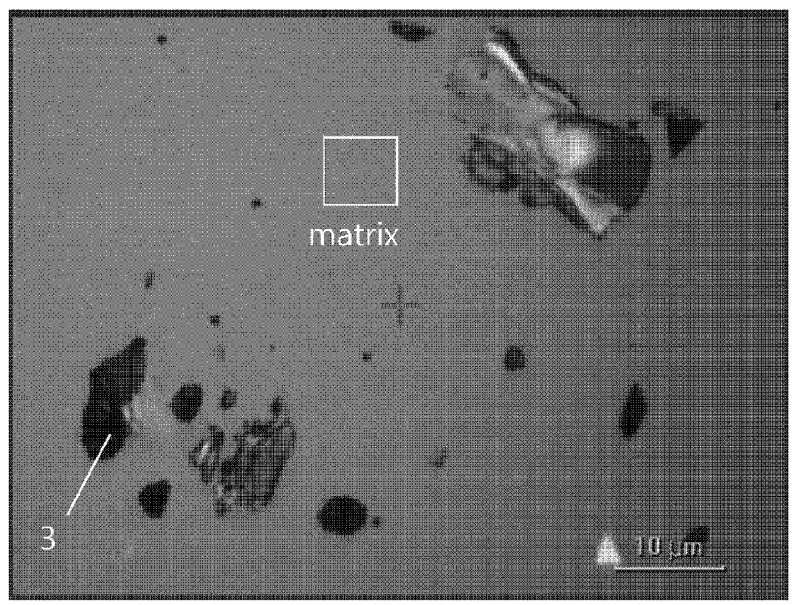
FIG. 14 is a sectional photograph of the sintered body of Example 3.
Figure 15:
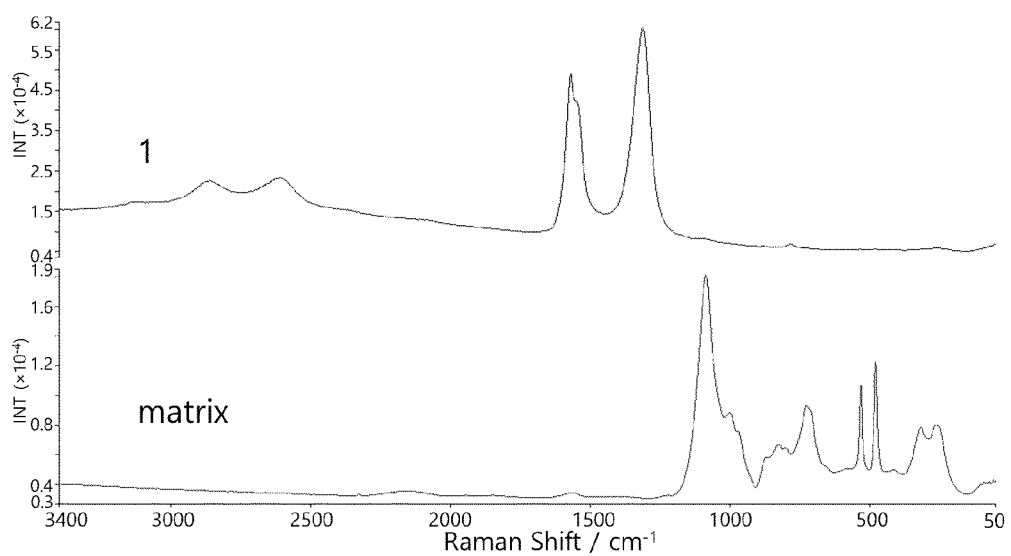
FIG. 15 is a Raman shift spectrum (3: a composite material/matrix: a base material) according to Raman spectroscopy of Example 3.
Figure 16:
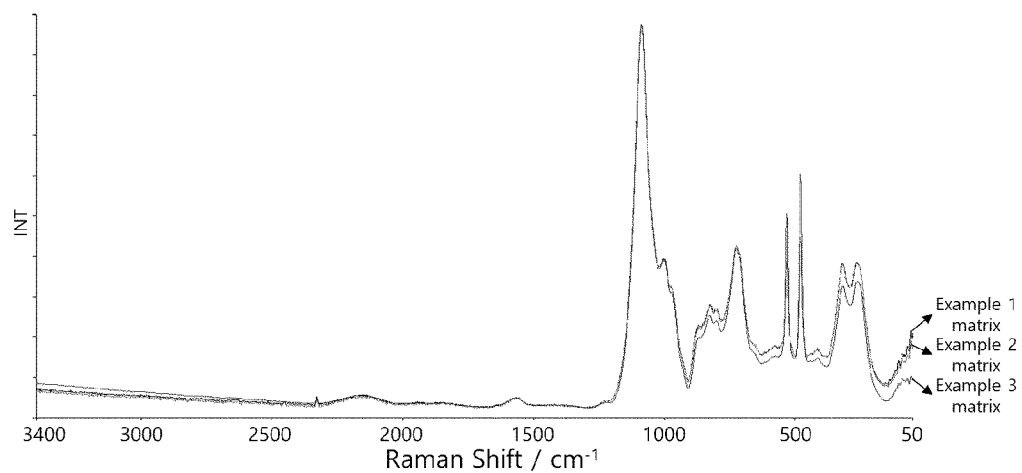
FIG. 16 is Raman shift spectrums according to Raman spectroscopy of base materials (matrix) of Example 1 to Example 3.

The ceramic component 10 may include a composite material and a base material filled in contact with the composite material. Referring to FIG. 5 and FIG. 6, the composite material and the base material can be identified on the surface of the ceramic component 10.

The composite material may include any one or more among boron carbide-based materials and carbon-based materials, and may have some pores.

The boron carbide-based material may have an $I_{ab}/I_{cd}$ ratio of 1.0 to 1.8, where the $I_{ab}/I_{cd}$ ratio is a ratio of a sum ($I_{ab}$) of strengths of peaks near 481 cm$^{-1}$ ($I_a$) and strengths of peaks near 534 cm$^{-1}$ ($I_b$) to a sum ($I_{cd}$) of strengths of peaks near 270 cm$^{-1}$ ($I_c$) and strengths of peaks near 320 cm$^{-1}$ ($I_d$), in a Raman shift spectrum measured through Raman spectroscopy. The $I_{ab}/I_{cd}$ ratio may be 1.1 to 1.6.

The wavenumber of the peak of the Raman shift spectrum from the boron carbide-based material of the composite material may be 270 cm$^{-1}$, 320 cm$^{-1}$, 481 cm$^{-1}$, 534 cm$^{-1}$, 728 cm$^{-1}$, 1088 cm$^{-1}$, and may have an error range of ±10 cm$^{-1}$, and in this time, one with the strongest strength within the error range of each wavenumber is considered as the peak.

Referring to the Raman shift spectrum of the single crystal boron carbide (B4C), it is shown that the peak near the wavenumbers of 270 cm$^{-1}$ and 320 cm$^{-1}$ is weaker than the peak near the wavenumbers of 481 cm$^{-1}$ and 534 cm$^{-1}$. The strength and full width at half maximum of peaks of 270 cm$^{-1}$, 320 cm$^{-1}$, 481 cm$^{-1}$, 534 cm$^{-1}$ may be varied depending on the conditions such as the carbon amount in the boron carbide-based material, the pressure during manufacture (sintering), and additives.

The boron carbide-based material of the composite material of the ceramic component 10 according to an embodiment has the above range of $I_{ab}/I_{cd}$, thereby showing good crystallinity in addition to having a certain carbon amount, and being harmonious with the base material. Accordingly, it is possible to secure proper strength and etching resistance suitable to the ceramic component of a plasma etching apparatus.

In the carbon-based material of the composite material, the peak of the Raman shift spectrum may be classified as two types of D band peak and G band peak. The D band may be approximately the wavenumber of 1360±50 cm$^{-1}$, and the G band may be approximately the wavenumber of 1580±50 cm$^{-1}$. The D band peak can be seen as not being caused from a graphite structure, and the G band can be seen as being caused from a graphite structure. Accordingly, as the ratio of the G band is higher, it may be considered that the ratio of graphite occupying the carbon-based material is higher.

The carbon-based material of the composite material may have an $I_e/I_f$ ratio of 0.2 to 2, which is the ratio of the strength of the G band peak ($I_e$) to the strength of the D band peak, from the Raman shift spectrum measured through Raman spectroscopy. The $I_e/I_f$ ratio may be 0.5 to 1.5. The carbon-based material of the composite material having such a characteristic can show proper crystallinity and be harmonious with a boron carbide-based material and the base material of the composite material.

The base material may include a boron carbide-based material, may include boron carbide, may be a coarse crystal grain compared to the composite material, and may have some pores.

The boron carbide material of the base material may have an $I_{ab}/I_{cd}$ ratio of 1.1 to 2.3, where the $I_{ab}/I_{cd}$ ratio is a ratio of a sum ($I_{ab}$) of strengths of peaks near 481 cm$^{-1}$ ($I_a$) and strengths of peaks near 534 cm$^{-1}$ ($I_b$) to a sum ($I_{cd}$) of strengths of peaks near 270 cm$^{-1}$ ($I_c$) and strengths of peaks near 320 cm$^{-1}$ ($I_d$), in a Raman shift spectrum measured through Raman spectroscopy. The $I_{ab}/I_{cd}$ ratio may be 1.15 to 2. By making the $I_{ab}/I_{cd}$ ratio to have the above range, the boron carbide-based material can show good crystallinity in addition to having a certain carbon amount, and can be harmonious with the composite material. According to the above, it is possible to secure proper strength and etching resistance suitable to the ceramic component of a plasma etching apparatus.

The size of the composite material may be 40 μm or less. The size of the composite material may be 30 μm or less. The size of the composite material may be 0.1 μm or more. The size of the composite material may be 0.3 μm or more. Also, the composite material may be disposed in a number of $2\times10^5$/cm$^2$ to $6\times10^5$/cm$^2$ per unit area (cm$^2$). The composite material may be disposed in a number of $2.5\times10^5$/cm$^2$ to $5.5\times10^5$/cm$^2$ per unit area (cm$^2$). The ceramic component having such a size and a number of the composite material can secure suitable strength and etching resistance when applied to a plasma etching apparatus.

The resistivity of the ceramic component 10 may be $10^{-2}$ Ω·cm to $10^{-1}$ Ω·cm which is relatively low resistance. The resistivity of the ceramic component may be $10^{-1}$ Ω·cm to 20 Ω·cm, which is relatively high resistance. Such a resistivity value may be obtained depending on the condition of room temperature or the condition of pressurizing during manufacture. In addition, the ceramic component having such a resistivity value may be suitable for further processing of shaping machining, and can exhibit good surface quality. The ceramic component 10 may include a placing part 200 having a first height from a reference plane; and a main part 100 having a second height from the reference place, wherein the placing part may include an upper surface of the placing part 206, where an etching target 1 is placed, and the main part may include an upper surface of the main part 106, which is directly etched by plasma.

At least some of the etching target 1 is disposed on the placing part 200 supporting the etching target such as a wafer.

The main part 100 adjusts the flow of plasma ions conveyed to an etching target such that the etching target is evenly etched having a desired form without a defect.

The main part 100 and the placing part 200 are described above as being distinguished from each other, but they may be prepared to be one body without distinction of a boundary thereof.

The placing part 200 has a first height, and the main part 100 has a second height.

The first height and the second height refer to the height to an upper surface of the placing part and the height to an upper surface of the main part based on a reference plane, respectively. Here, the reference plane may be, for example, the lowest base plane between a base plane of the main part and a base plane of the placing part.

The first height and the second height may be different from each other, and in detail, the second height may be higher than the first height.

The upper surface 206 of the placing part 200 may be one body type without separate distinction in layers, or a distinguished type having distinction of the placing part and the upper surface of the placing part when observed from the section thereof. For the distinguished type, the upper surface of the placing part may be a deposition layer or a coating layer. The deposition layer or the coating layer may be for example, a layer including the base material and the composite material. When the upper surface of the placing part is a distinguished type, the upper surface of the placing part in the form of the deposition layer or the coating layer may have a thickness of 1 to 40% of the thickness of the placing part based on a value before being etched. The upper surface of the placing part may have a thickness of 5 to 25% of the thickness of the placing part based on a value before being etched.

The upper surface of the placing part 206 may include an unexposed surface of the placing part, where an etching target 1 is disposed on, and an exposed surface of the placing part, where the etching target is not disposed on.

The main part 100 and the upper surface 106 of the main part 100 may be one body type without separate distinction in layers, or a distinguished type having distinction of the main part and the upper surface of the main part when observed from the section thereof. For the distinguished type, the upper surface of the placing part may be a deposition layer or a coating layer. The deposition layer or a coating layer may be for example, a layer including the base material and the composite material. When the upper surface of the placing part is a distinguished type, the upper surface of the placing part in the form of the deposition layer or the coating layer may have a thickness of 1 to 40% of the thickness of the placing part based on a value before being etched. The upper surface of the placing part may have a thickness of 5 to 25% of the thickness of the placing part based on a value before being etched.

The ceramic component 10 may further include a gradient part 150 connecting the placing part 200 and the main part 100.

The placing part 200 and the main part 100 are different in the height from each other, and the gradient part 150 can connect the different heights thereof.

The main part 100, the placing part 200, and the gradient part 150 are described by being distinguished, but they may be prepared to be distinguished from each other or may be prepared to be one body without distinction of a boundary thereof.

The gradient part 150 includes an upper surface 156 of the gradient part 150 connecting the upper surface 206 of the placing part 200 and the upper surface 106 of the main part 100.

The gradient part 150 and the upper surface 156 of the gradient part 150 may be one body type without separate distinction in layers, or a distinguished type having distinction in layers of the gradient part and the upper surface of the gradient part when observed from the section thereof. For the distinguished type, the upper surface of the gradient part may be a deposition layer or a coating layer. The deposition layer or the coating layer may be for example, a layer including the base material and the composite material. When the upper surface of the gradient part is a distinguished type, the upper surface of the gradient part in a form of the deposition layer or the coating layer may have a thickness of 1 to 40% of the thickness of the gradient part based on a value before being etched. The upper surface of the gradient part may have a thickness of 5 to 25% of the thickness of the gradient part based on a value before being etched.

The upper surface of the gradient part 156 is disposed to have an angle with respect to the upper surface 106 of the main part 100 and the upper surface 206 of the placing part 200 (not shown). The angle of the gradient part may be measured based on the unexposed surface of the placing part, and may have an angle of more than about 0 degree and about 110 degrees or less.

When the length of the gradient part 150 is 0 mm, the angle of the placing part and the main part may be about 90 degrees or more and about 110 degrees or less. When the length of the gradient part 150 is more than about 0 mm and less than about 90 degrees, the gradient part may have a length of more than 0 mm.

The angle of the gradient part 150 may be a linear type or nonlinear type when the upper surface 156 of the gradient part 150 is observed from the section thereof, and the angle of the gradient part 150 is measured based on a virtual line linking two points of P1 (not shown), where the upper surface 206 of the placing part 200 and the upper surface 156 of the gradient part 150 meet at the section and P2 (not shown) where the upper surface 156 of the gradient part 150 and the upper surface 106 of the main part 100 meet.

For example, the angle of the gradient part 150 may be about 30 degrees to about 70 degrees based on the unexposed surface of the placing part 200. The angle of the gradient part 150 may be about 40 degrees to about 60 degrees. When having such an angle of the gradient part 150, the flow of plasma can be further stably controlled.

The placing part 200, the gradient part 150, and the main part 100 may be ring type shapes, respectively, but they are not necessarily limited thereto, and the shape of the placing part 200, the gradient part 150, and the main part 100 may be modified depending on the shape of an etching target 1.

The ceramic component may include a material difficult to be processed by shaping machining such as a material with high etching resistance. A conventional focus ring as an ordinary ceramic component may often break during a shaping machining process including a gap forming process. The present disclosure discloses an improved ceramic component having a Raman characteristic for easier shaping machining through a material having further improved characteristics.

The ceramic component 10 has PS1 as one spot of the upper surface of the placing part, PS2 as one spot of the upper surface of the gradient part, and PS3 as one spot of the upper surface of the main part.

The ceramic component 10 may have a difference between the maximum residual stress value and the minimum residual stress value measured at PS1 and PS3, and the difference is within 40% of the average residual stress value measured at PS 1 and PS 3. The difference may be within 15% of the average residual stress value measured at PS 1 and PS 3. The difference may be within 10%, or 1 to 10% of the average residual stress value measured at PS 1 and PS 3. A ceramic component having such a characteristic can have stabler processability and stability.

The ceramic component 10 may have a difference of −600 to +600 MPa between the residual stress value measured at PS1 and the residual stress value measured at PS3. The difference may be −300 to +300 MPa. The difference may be −200 to +200 MPa. The difference may be −150 to +150 MPa. The difference may be −130 to +130 MPa. In such a case, it is possible to obtain a ceramic component with an excellent processability in addition to having a higher density.

The ceramic component 10 may have a standard deviation of 300 MPa or less of residual stress values measured at PS1, PS3, and PS2, respectively. The standard deviation may be 250 MPa or less. The standard deviation may be 150 MPa. The standard deviation may be 75 MPa or less. The standard deviation may be more than 0 MPa. The standard deviation may be 0.1 MPa or more. When having such a standard deviation, it is possible to obtain a focus ring with excellent processability in addition to having a higher density.

The ceramic component 10 may have a standard deviation of residual stress values measured at PS1, PS3, and PS2, respectively, which is 20% or less of the average of the residual stress values measured at PS1, PS2, and PS3. The standard deviation may be 15% or less of the average. The standard deviation may be 8% or less of the average. When having such a characteristic, it is possible to obtain a ceramic component with excellent processability in addition to having a higher density.

The ceramic component 10 may have residual stress values measured at PS1, PS3, and PS2, respectively, having a difference of −350 to +350 MPa from the average of residual stress values measured at PS1, PS2, and PS3. The difference may be −300 to +300 MPa from the average. The difference may be −250 to +250 MPa from the average. The difference may be −200 to +200 MPa from the average. When having such a characteristic, it is possible to obtain a focus ring with excellent processability in addition to having a higher density.

The ceramic component 10 may have a difference between the maximum and the minimum of residual stress values measured at the PS1, the PS3, and the PS2, respectively, which is within 25% of the average thereof. The ceramic component 10 may have the difference within 20% of the average thereof. The difference may be within 15% of the average thereof. Also, the difference may be within 10% of the average thereof. The difference may be within 5% of the average thereof. The difference may be 1% or more of the average thereof. When having such a distribution of residual stress, it is possible to operate stabler shaping machining, and it is possible to obtain a stabler etching resistance material.

The ceramic component 10 may have a standard deviation of residual stress values measured at spots on the surfaces having different distances from the center, which is 350 MPa or less. The standard deviation may be 300 MPa or less. The standard deviation may be 250 MPa or less. The standard deviation may be 200 MPa or less. The standard deviation may be 120 MPa or less. The standard deviation may be 100 MPa or less.

As confirmed by the inventors through repetitive measurements, the residual stress values measured at the surfaces of various spots with the same distance from the center do not have a great difference. Accordingly, when having a characteristic as the above, the distribution of residual stress values is substantially and relatively uniform and it is thought that a ceramic component and a focus ring excellent in processability, stability, and the like can be provided.

As describing the center of the ceramic component 10, for a ceramic component in a ring type shape, the center of the inner diameter circle corresponds to the center of the ceramic component, and for a ceramic component not in a ring type shape, the intersecting point of a long axis and a short axis is referred to as the center.

The ceramic component 10 may be surface-treated by polishing. The ceramic component may have the upper surface 206 of the placing part 200 and the upper surface 106 of the main part 100 treated by polishing, or may have the upper surface 206 of the placing part 200 and the upper surface 106 of the main part 100, and the upper surface 156 of the gradient part 150 treated by polishing, respectively.

The arithmetic mean roughness $R_a$ of the surface of the ceramic component may be 2 μm or less. The arithmetic mean roughness $R_a$ may be 1.7 μm or less. The arithmetic mean roughness $R_a$ may be 0.05 μm or more.

The maximum height roughness $R_t$ of the surface of the ceramic component 10 may be 0.1 to 25 μm. The maximum height roughness $R_t$ may be 0.1 to 10 μm. The maximum height roughness $R_t$ may be 0.1 to 5 μm. The maximum height roughness $R_t$ may be 0.1 to 2 μm.

For example, the arithmetic mean roughness $R_a$ of the upper surface 106 of the main part 100 may be 0.5 μm or less, and the maximum height roughness $R_t$ may be 8 μm or less. The arithmetic mean roughness $R_a$ may be 2 μm or less, and the maximum height roughness R may be 15 μm or less. The arithmetic mean roughness $R_a$ may be 2 μm or less, and the maximum height roughness $R_t$ may be 15 μm or less. When having such a roughness characteristic, it is possible to suppress the problem of particle formation, which may occur from physical factors during plasma etching.

The ceramic component 10 as a ring type component may have a difference between the outer diameter and the inner diameter of 10 to 80 mm. The difference may be 15 to 60 mm. The difference may be 20 to 50 mm.

The ceramic component 10 as a ring type component may have a thickness of 1 to 45 mm. The thickness may be 1.5 to 40 mm. The thickness may be 2 to 38 mm.

The ceramic component 10 as a ring type component may have an inner diameter of 160 mm or more. The inner diameter may be 200 mm or more. The inner diameter may be 300 mm or more. The inner diameter may be 450 mm or less.

The ceramic component 10 may have a porosity of about 10% or less. The porosity may be about 3% or less. The porosity may be about 1% or less. The porosity may be 0.01% or more. The ceramic component with such a low porosity can exhibit better etching resistance.

The ceramic component 10 may have an average diameter of 5 μm or less of pores observed at the surface or the section thereof. The average diameter of the pores may be 3 μm or less. The average diameter of the pores may be 1 μm or less. The average diameter of the pores may be 0.1 μm or more. Also, based on the entire area of the pores, the area of a portion having the diameter of the pore, which is 10 μm or more, may be 5% or less. The ceramic component having such an average diameter of pores can have improved etching resistance. Here, the average diameter of the pores is derived by the diameter of a circle with the same area as the cross-section area of the pores.

In the boron carbide-based material, particles containing boron carbide may be necked from one another.

The ceramic component 10 may include boron carbide, which is deposited, and/or boron carbide, which has sintered.

The ceramic component 10 may include a boron carbide-based material, and the boron carbide-based material may be boron carbide ($B_4C$). The ceramic component may include boron carbide in an amount of 85 wt % or more compared to a total weight of the ceramic component. The ceramic component may include boron carbide in an amount of 90 wt % or more compared to the total weight. The ceramic component may include boron carbide in an amount of 93 wt % or more compared to the total weight. The ceramic component may also include boron carbide in an amount of 99.9 wt % or less compared to the total weight.

The ceramic component 10 may include a carbon-based material other than a boron carbide material. The amount of the carbon-based material other than a boron carbide material may be 0.5 wt % or more compared to the total weight of the ceramic component. The amount may be 1 wt % or more. The amount may be 15 wt % or less. The amount may be 10 wt % or less. A ceramic component satisfying such an amount of a carbon-based material other than a boron carbide material can exhibit excellent etching resistance.

The ceramic component 10 may function as a supporting body for supporting an etching target 1 and a wafer when the etching target 1 and a wafer are disposed in a chamber of a plasma etching apparatus.

Manufacturing Method of Ceramic Component

In a general aspect, a manufacturing method of a ceramic component according to another embodiment may include: a preparation operation of preparing at least one raw material selected from the group consisting of a first raw material including boron carbide, a second raw material including boron carbide, boron oxide, and a carbon-based material, and a third raw material including boron carbide and a carbon-based material; and a treatment operation of preparing the ceramic component by sintering and shaping machining the at least one raw material.

In the preparation operation, the raw material includes boron carbide powder. The boron carbide powder may be a high purity boron carbide powder including boron carbide in an amount of 99.9 wt % or more. The boron carbide powder may be a low purity boron carbide powder including boron carbide in an amount of 95 to 99.9 wt %.

The boron carbide powder may have an average diameter of about 1.5 μm or less based on $D_{50}$. The boron carbide powder may have an average diameter of about 0.3 μm to about 1.5 μm based on $D_{50}$. The boron carbide powder may have an average diameter of about 0.4 μm to about 1.0 μm based on $D_{50}$. Also, the boron carbide powder may have an average diameter of about 0.4 μm to about 0.8 μm based on $D_{50}$. When a powder with a small average diameter is used, a fine sintering body may be obtained.

The boron carbide powder may have a diameter of 2 μm to 10 μm based on $D_{50}$. The boron carbide powder may have a diameter of 3 μm to 8 μm based on $D_{50}$. The boron carbide powder may have a diameter of 4 μm to 6 μm based on $D_{50}$. When a boron carbide powder having such a diameter range is used, productivity can be improved and a fine sintering body may be obtained.

The raw material may further include an additive. The additive may be added to a process of manufacturing the ceramic component in a powder form, a liquid form, or a gas form. Non-limiting examples of the additive may include a carbon-based material, boron oxide, silicon, silicon carbide, silicon oxide, boron nitride, boron, boron nitride, and combinations thereof. The additive may be included in an amount of about 0.1 wt % to about 30 wt % based on the total weight of the raw material.

The additive may be an improver for sintering characteristics. The improver is comprised in the raw material and improves the properties of a boron carbide. The improver may be at least one selected from the group consisting of a carbon-based material, boron oxide, silicon, silicon carbide, silicon oxide, boron nitride, silicon nitride, and combinations thereof. The improver may be included in an amount of about 30 wt % or less based on the total weight of the raw material. Specifically, the improver may be included in an amount of about 0.001 wt % to about 30 wt % based on the total weight of the raw material. The improver may be included in an amount of 0.1 to 15 wt % based on the total weight of the raw material. The improver may be included in an amount of 1 to 10 wt % based on the total weight of the raw material. When the improver is included in an amount of more than 30 wt %, the strength of a sintering body may be decreased instead.

The raw material may include a boron carbide raw material such as a boron carbide powder, in a residual amount other than the improver of sintering characteristics.

When a carbon-based material is used as the improver of sintering characteristics, a resin, which may be converted into carbon when carbonated, such as a phenol resin and a novolak resin, may be used as the carbon-based material. Also, a carbonated carbon, which is obtained from the resin through a carbonation process, may also be used. The carbonation process of the resin may be a conventional process carbonating a polymeric resin. The phenol resin may include a residual carbon in an amount of 40 wt % or more.

When a carbon-based material is used as the improver of sintering characteristics, the carbon-based material may be included in an amount of 1 wt % to 30 wt % based on the total weight of the raw material. The carbon-based material may be included in an amount of 1 wt % to 25 wt % based on the total weight of the raw material. The carbon-based material may be included in an amount of 2 wt % to 15 wt % based on the total weight of the raw material. The carbon-based material may be included in an amount of 3 wt % to 10 wt % based on the total weight of the raw material. When a carbon-based material in such an amount is included as the improver of sintering characteristics, necking among particles can be induced well and a boron carbide with a relatively large particle size and a relatively high density can be obtained. However, when the carbon-based material is included in an amount of more than 10 wt %, during pressurizing in a sintering process, occurrence of gases such as carbon dioxide may be excessive, and workability may be decreased.

When the boron oxide and the carbon are included together as the improver of sintering characteristics, the relative density of the sintering body may be further increased, thereby area of carbons present in pores may be decreased, and a fine sintering body can be manufactured.

The boron oxide and the carbon may be included in a weight ratio of 1:0.8 to 4. In such a case, a sintering body further improved in the relative density can be obtained.

The raw material may further include a dispersant, a binder, a defoamer, a solvent, and the like as needed.

The dispersant may be 2-propenoic acid, ethanol, sodium salt, ammonium salt, or the like. The dispersant may be included in an amount of 0.08 to 2 wt % based on the total weight of the raw material. The dispersant may be included in an amount of 0.1 to 1.5 wt % based on the total weight of the raw material.

The binder may be polyvinyl butyral, polyvinyl alcohol, a phenol resin, an acrylic resin, or the like.

The defoamer may be a nonionic surfactant or the like.

The solvent may be DI water, ethanol, toluene, or the like.

The raw material does not include a material, which may generate a by-product in a solid-state during semiconductor processes, or includes the material in a very low amount. For example, as the material, which can generate by-product, a metal such as iron, copper, chrome, nickel, or aluminum may be included. The amount of the material, which may generate by-product, may be 500 ppm or less based on the total weight of the raw material.

The preparation operation may include a process of preparing a raw material grain by making the raw material to be a slurry and to be granulated.

The slurry-making is a process of mixing the raw material sufficiently and substantially uniformly by a method of ball milling or the like. A solvent may be used in the slurry-making, and an alcohol such as methanol, ethanol or butanol, or water may be used as the solvent. The solvent may be included in an amount of about 60 volume % to about 80 volume % based on the total volume of the slurry. The ball milling may be performed by applying a polymer ball, and the slurry-making process may proceed for about 5 hours to about 20 hours.

The slurry raw material manufactured through the slurry-making may have a zeta potential of +15 mV or more. The zeta potential of the slurry raw material may be +17.4 mV or more. The zeta potential of the slurry raw material may be +20.6 mV or more. The zeta potential of the slurry raw material may be +25 mV or more. Also, the slurry raw material may have the zeta potential of +40 mV or less. The slurry having such a range of zeta potential may have inner materials that have been evenly dispersed and can exhibit uniform properties when sintering through subsequent processes.

The granulation may be achieved by a method, in which a solvent included in the slurry is removed through evaporation and the like and thereby a raw material is granulated while the slurry is injected. The granulated raw material particles manufactured in this manner have round shapes overall themselves and can have a characteristic of relatively regular particle sizes.

The raw material grains after passing through the granulation process may have a size of 50 μm to 160 μm. The raw material grains may have a size of 60 μm to 100 μm. When the raw material grains having such a characteristic are applied, filling in a mold can be easily made during subsequent processes such as sintering, and the workability can be further increased.

The treatment operation may include a process of filling the raw material into a mold or a shaping die to sinter. The treatment operation may include a shaping process of forming a shaping body in a desired shape from the raw material grains before sintering. The shaping process may include Cold Isostatic Pressing (CIP), Green Processing, and the like.

The treatment operation may include a carbonation process of carbonating the raw material grains filled in the mold, shaping die, and the like before sintering or the shaping body after the shaping process has been completed, and according to this, an organic additive such as a phenol resin and a novolak resin can be carbonated.

The sintering of the treatment operation may be performed by sintering with pressurizing or sintering at room temperature.

There have been many conventional attempts for manufacturing a boron carbide sintering body through the method of sintering with pressurizing. However, it is manufactured and evaluated for a small sample with a size of about 30 mm vertically and horizontally, which is ordinarily referred to as a coupon. The manufacture of a boron carbide sintering body with a relatively large diameter is not easy.

When a pressurized sintering body with a relatively large size is made, it is preferred that a pressurized sintering body having uniform characteristics (properties) overall in itself is manufactured. However, it is not easy to manufacture a pressurized sintering body having relatively uniform characteristics overall in itself. Particularly, the pressurized sintering body has a characteristic of easily causing a crack, fracture, and the like during shaping machining, differently from a sintering body at room temperature. It may be considered that such a characteristic is caused from one reason in that a sintering body has ununiform characteristics overall.

The mold of the treatment operation may be one having a length or a diameter of 450 mm or more. For manufacturing a ceramic component as a ring type component with a diameter of 320 mm, the manufacture of a sintering body having considerably large diameter or length is required. In consideration of ordinary cases allowing the size of a sintering body to be reduced during a sintering process, and the amount of the ceramic component being lost in a process of performing shaping machining for the ceramic component to have a fine ring shape, the mold is preferred to have a size of 450 mm or more. The mold may have a size of 450 to 600 mm.

The sintering may be performed under optimum sintering temperature and sintering pressure.

The sintering temperature may be about 1800° C. to about 2500° C. The sintering temperature may be about 1800° C. to about 2200° C. The sintering pressure may be room temperature. The sintering pressure may be about 10 MPa to about 110 MPa. The sintering pressure may be about 15 MPa to about 60 MPa. The sintering pressure may be about 17 MPa to about 30 MPa. When the shaping operation is performed under such sintering temperature and sintering pressure, it is possible to manufacture a ceramic component with high quality more efficiently.

The sintering time may be 0.5 hours to 10 hours in the case of sintering with pressurizing. The sintering time may be 0.5 hours to 7 hours. The sintering time may be 0.5 hours to 4 hours. The sintering time of the sintering with pressurizing is considerably short time compared to a sintering process proceeding at room temperature, and even though such a short time is applied, it is possible to manufacture a ceramic component with the equal or more excellent strength.

The sintering may be performed in a reduction atmosphere. In this case, materials such as boron oxide, which may be formed by reacting a boron carbide powder with oxygen in air, may be reduced, and it is possible to manufacture a boron carbide with high etching resistance, in which the amount of boron carbide may be increased more, and the area, where carbons aggregated, is decreased.

In the sintering process, the boron carbide powder is grown and necked from one another and form a sintering body with a great strength. Additionally, an additive applied together may suppress or accelerate the growth of boron carbide powder while the additive itself changes depending on the temperature and pressure. Besides, through sintering with pressurizing, a pressurized sintering body can have further elaborated minute structure.

The manufacturing method of a ceramic component may include a subsequent thermal treatment operation after the thermal treatment of the treatment operation.

The subsequent thermal treatment operation includes a primary treatment proceeding for 2 hours or more at a first temperature and a secondary treatment proceeding for 2 hours of more at a second temperature, and the first temperature may be higher than the second temperature.

The first temperature may be 1650° C. or more, and the second temperature may be 1400° C. When the primary treatment and the secondary treatment proceed in such a temperature range, thermal treatment can be further effectively performed.

The first temperature may be a temperature of 1650 to 1950° C. The primary treatment may proceed for 1 hour to 8 hours.

The second temperature may be a temperature of 1400 to 1600° C. The secondary treatment may proceed for 1 hour to 8 hours.

When the subsequent thermal treatment is performed in the first temperature and the second temperature, the processability of shaping machining of a pressurized sintering body become considerably increased. This may be considered to be a result of the change of a residual stress caused from the thermal treatment.

The shaping machining of the treatment operation is an operation of detaching or removing some of the sintering body to have a desired shape. The shaping machining include a ring processing for processing a sintering body to have a ring shape and a shaping machining processing for forming the sintering body after passing through the ring processing into a shape of a focus ring.

The shaping machining may be performed by Electric Discharge Machining (EDM), a waterjet method, a laser method, and the like, but it is not necessarily limited thereto.

After a desired shape is formed through the shaping machining, a polishing process may be further performed. The polishing process is a process of lowering the surface roughness of the ceramic component, for suppressing the formation of particles through a physical method. The polishing process may proceed as a polishing process applied with slurry containing a diamond for industrial use, and for manufacturing a ceramic component excellent in the characteristic of suppressing particles. The polishing may be performed to reach a maximum height roughness (Rt) of 15 µm or less, and an arithmetic mean roughness (Ra) of 2 µm or less.

Figure 4:
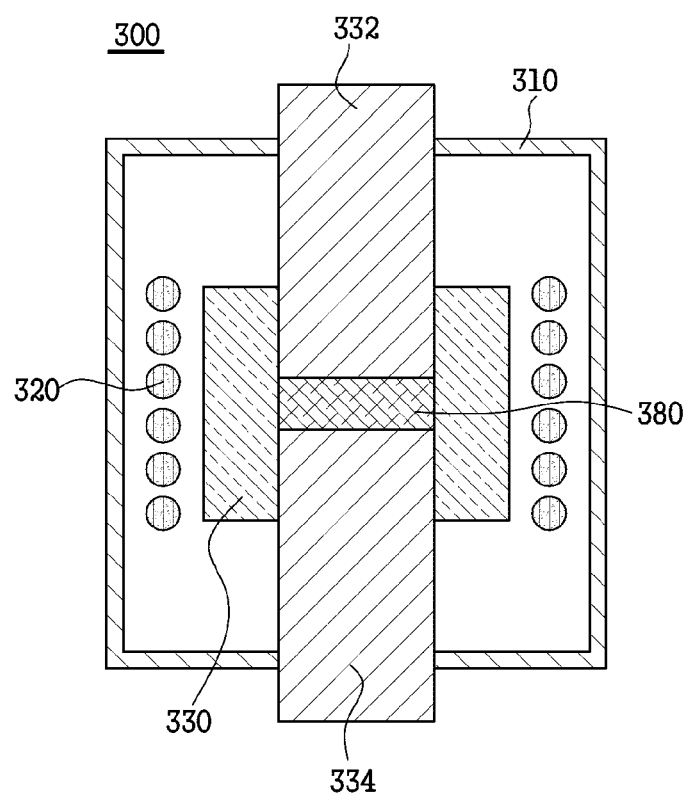
FIG. 4 is a conceptual view for illustrating a sintering apparatus used in the process of manufacturing the ceramic component according to an embodiment.

In the manufacturing method of the ceramic component, the sintering may be performed through the sintering apparatus 300 (hot-pressing sintering machine) illustrated in FIG. 4.

When a raw material 380 is charged in a mold 330 disposed between an upper pressurizer 332 and a lower pressurizer 334 in a sintering furnace 310 of the sintering apparatus 300, pressurizing and heating are applied, and sintering can be performed. Here, the inside of the sintering furnace 310 may be adjusted to be depressurizing atmosphere, or the sintering may be performed in a reduction atmosphere. The mold 330 may be, for example, a graphite die, and the upper pressurizer 332 and the lower pressurizer 334 may be a graphite tool (punch).

In addition, the manufacturing method of the ceramic component may be performed in a spark plasma sintering apparatus, which can apply a pulse current to a raw material.

Plasma Etching Apparatus 500

The plasma etching apparatus 500 according to an embodiment includes the ceramic component 10 disposed in at least some parts of the apparatus.

Figure 3:
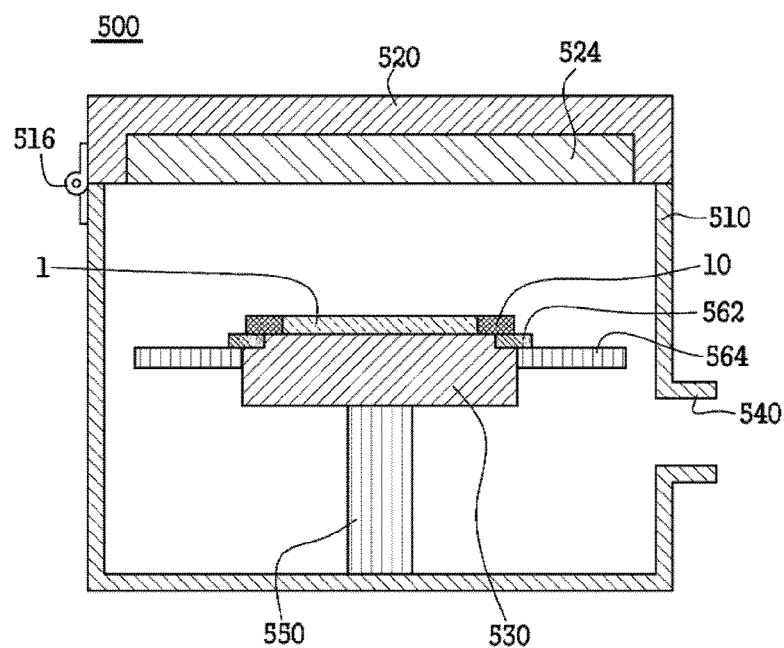
FIG. 3 is a conceptual view for illustrating the structure of an etching apparatus including the ceramic component according to an embodiment.

Referring to FIG. 3, the plasma etching apparatus 500 has an upper chamber assembly 520 and a chamber housing 510 connected by a connecting part 516, and an electrode plate assembly including an electrode is installed in the upper chamber assembly 520. In the chamber housing 510, a substrate holder 530 which can be ascended and descended by a vertical moving device 550 is installed, and a ceramic component 10 as a focus ring is installed in the position, where a wafer as an etching target 10 is placed.

A baffle plate 564 may be installed near the substrate holder 530. A shield ring 562 may be further installed between the substrate holder 530 and a baffle plate 564.

The etching apparatus 500 can achieve etching of a substrate more efficiently by applying the ceramic component 10 described above as a focus ring or the like.

Plasma Etching Method

An etching method of a substrate according to an embodiment includes, an arrangement operation of disposing an etching target 1 in an etching apparatus, in which a focus ring including the ceramic component 10 has been placed; and an etching operation of performing etching of the etching target to prepare a substrate.

The arrangement operation is an operation of disposing an etching target in an etching apparatus, in which a ceramic component is disposed as a focus ring. Any apparatus for etching a substrate applied to electronic products and the like is applicable as the etching apparatus without limitation, and for example, a plasma etching apparatus may be applied.

The substrate is one applicable to the etching apparatus as an etching target, and for example, a substrate used in a semiconductor device such as a silicon substrate may be applied.

The focus ring and the ceramic component 10 are the same as described above.

The arrangement operation may allow the etching target to be placed on an upper surface of the placing part 206 of the focus ring.

The etching operation is an operation of etching the etching target to prepare a substrate. The etching may be performed by conventional processes applied to an etching process such as depressurizing with heating, supplying a plasma gas, etching, and washing.

The etching may be performed under the condition of a chamber pressure of 500 mTorr or less, an etching gas including a fluorine-containing compound or a chlorine-containing compound, and an electric power of 500 W to 15,000 W. The chamber pressure may be 100 mTorr or less, or 10 mTorr or more.

The electric power may be an RF electric power of 500 W to 15,000. The electric power may be an RF electric power of 500 to 8000 W.

The etching time may be 100 hours or more, or 200 hours or more. The etching time may be 400 hours or more. The etching time may be 800 hours or more. The etching time may be modified depending on the plasma electric power, etching gas, and the like to be applied.

Hereinafter, the present disclosure will be described in further detail with reference to accompanying examples. The following embodiments are only examples for understanding the present disclosure, and the range of the present disclosure is not limited to the same.

Example 1—Manufacture of Ceramic Component

Manufacture of Sintering Body in Disk Shape Applying Method of Pressurizing and Sintering Raw materials including a boron carbide powder (particle size of D50=0.7 μm) and a phenol resin (residual carbon rate of about 41 wt %), and a solvent were placed in a slurry blender in a ratio of the amounts shown in Table 1 below, and mixed by a method of ball-milling to manufacture a raw material made into a slurry form. This slurry-formed raw material was sprayed and dried to prepare a raw material made into a granulated form.

The granulated raw material was filled in a mold and the temperature, pressure and time disclosed in Table 1 below were applied to manufacture a disk-shaped boron carbide sintering body with a diameter of about 488 mm.

Thereafter, among thermal treatments 1 to 3 as follows, thermal treatment 3 was performed.

Thermal treatment 1 performs thermal treatment to the sintering body for 2 to 5 hours at a temperature of 1400 to 1600° C.

Thermal treatment 2 performs a primary treatment to the sintering body for 2 to 3.5 hours at a temperature of 1650 to 1950° C. and a secondary treatment for 3 to 6 hours at a temperature of 1400 to 1600° C.

Thermal treatment process 3 performs a primary treatment to the sintering body by for 4 to 6 hours at a temperature of 1650 to 1950° C. and a secondary treatment for 3 to 6 hours at a temperature of 1400 to 1600° C.

Example 2—Manufacture of Ceramic Component

Other than applying a raw material satisfying the ratio of the amount and the zeta potential shown in Table 1 and applying the sintering condition of Table 1, a boron carbide sintering body was manufactured in the same manner as the Example 1.

Example 3—Manufacture of Ceramic Component

Other than applying a raw material satisfying the ratio of the amount and the zeta potential shown in Table 1, a boron carbide sintering body was manufactured in the same manner as the Example 1.

TABLE 1

| Index | Additive* (wt %) | Additive* (wt %) | Dispersant* (wt %) | Zeta Potential of Slurry Raw Material | Boron Carbide Powder (wt %) | Sintering Condition |
|---|---|---|---|---|---|---|
| Example 1 | — | — | — | +17.4 mV | Residual Amount | 1950° C.//5 Hours//25 MPa |
| Example 2 | 24 | 2 | — | +20.6 mV | Residual Amount | 1950° C.//5 Hours |
| Example 3 | 4 | — | 0.14 | +27.8 mV | Residual Amount | 1950° C.//5 Hours//25 MPa |

*Additive 1 was a phenol resin, and additive 2 was a boron oxide.

Experimental Example—Measurement of Slurry-Formed Raw Material

The slurry-formed raw materials of the Examples 1 to 3 were diluted in an ethanol solvent of 20 mL by 2 to 3 drops, respectively, and subdivided in a flow cell to measure the zeta potentials thereof, and the result was shown in Table 1 and the like. As for the condition of the solvent, the temperature was 25° C., the refractive index was 1.36, the viscosity was 1.1 cP, and the dielectric constant was 25.

Experiment Example—Raman Analysis of Sintering Body and Boron Carbide Single Crystal By using DxR2 as a Raman spectrum measuring device available from THERMO SCIDETIFIC corporation, Raman analysis was performed under the measuring condition below and the result was shown in FIGS. 7 to 16 and Table 2. From the photographs and spectrums indicated in FIGS. 7 to 16, 1, 2 and 3 refer to the composite materials according to Examples 1-3, and the matrix refer to the base material.

Excitation Wavelength: 532 nm
Output: 10 mW
Repetition Rate: 6 Hz
Scan Scope: 6×6 μm
Pixel Size: 2.0 μm
The Number of Spectrums for Measurement: 16

TABLE 2

|  | Example 1 | Example 2 | Example 3 | Boron Carbide Single Crystal |
|---|---|---|---|---|
| Composite Material $I_{ab}/I_{cd}$ | 1.34 | — | 1.15 | — |
| Composite Material $I_e/I_f$ | — | 1.4 | 0.81 | — |
| Base Material $I_{ab}/I_{cd}$ | 1.04 | 1.09 | 1.34 | 0.27 |

* $I_{ab}/I_{cd}$: From Raman shift spectrum, the ratio of the sum ($I_{ab}$) of the strengths of the peaks near 481 cm$^{-1}$ ($I_a$) and the strengths of peaks near 534 cm$^{-1}$, to the sum ($I_{cd}$) of the strengths of peaks near 270 cm$^{-1}$ ($I_c$) to the strengths of peaks near 320 cm$^{-1}$ ($I_d$).
*$I_e/I_f$: From Raman shift spectrum, the ratio of the strength of the G band peak ($I_e$) to the strength of the D band peak ($I_f$).

Referring to Tables 1 and 2, and FIGS. 7 to 16, the composite material and the base material filled in contact with the composite material can be confirmed in the sectional photographs of the manufactured sintering bodies, and it can be known that any one or more among carbon-based materials and boron carbide-based materials are included in the composite material.

It was confirmed that the ceramic component according to an embodiment was manufactured through a slurry-formed raw material with a zeta potential of 15 mV or more, and it was also confirmed that the boron carbide-based material included in the base material shows the $I_{ab}/I_{cd}$ ratio of 1 to 1.8 compared to the boron carbide single crystal and formed in contact with the composite material. It was also confirmed that the Examples had excellent processability and etching resistance without the occurrence of a crack or the like between the base material and the composite material.

While this disclosure includes specific examples, it will be apparent after an understanding of the disclosure of this application that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner, and/or replaced or supplemented by other components or their equivalents. Therefore, the scope of the disclosure is defined not by the detailed description, but by the claims and their equivalents, and all variations within the scope of the claims and their equivalents are to be construed as being included in the disclosure.

What is claimed is:

1. A ceramic component comprised in a plasma etching apparatus,
wherein a surface of the ceramic component comprises a base material and a composite material disposed in contact with the base material,
wherein a resistivity of the ceramic component is $10^{-1}$ $\Omega \cdot cm$ to 20 $\Omega \cdot cm$, and
wherein the base material comprises a first boron carbide-based material and the composite material comprises at least one selected from the group consisting of a second boron carbide-based material, a carbon-based material, and combinations thereof,
wherein the second boron carbide-based material of the composite material has an $I_{ab}/I_{cd}$ ratio of 1.0 to 1.8, where the $I_{ab}/I_{cd}$ ratio is a ratio of a sum ($I_{ab}$) of strengths of peaks near 481 $cm^{-1}$ ($I_a$) and strengths of peaks near 534 $cm^{-1}$ ($I_b$) to a sum ($I_{cd}$) of strengths of peaks near 270 $cm^{-1}$ ($I_c$) and strengths of peaks near 320 $cm^{-1}$ ($I_d$), in a Raman shift spectrum measured through Raman spectroscopy,
wherein the carbon-based material of the composite material has an $I_e/I_f$ ratio of 0.2 to 2, where the $I_e/I_f$ ratio is a ratio of a strength of G band peak ($I_e$) to a strength of D band peak ($I_f$), in the Raman shift spectrum.

2. The ceramic component of claim 1, wherein a size of the composite material is 40 μm or less.

3. The ceramic component of claim 1, wherein the second boron carbide-based material of the composite material has an $I_{ab}/I_{cd}$ ratio of 1.1 to 2.3, where the $I_{ab}/I_{cd}$ ratio is a ratio of a sum ($I_{ab}$) of strengths of peaks near 481 $cm^{-1}$ ($I_a$) and strengths of peaks near 534 $cm^{-1}$ ($I_b$) to a sum ($I_{cd}$) of strengths of peaks near 270 $cm^{-1}$ ($I_c$) and strengths of peaks near 320 $cm^{-1}$ ($I_d$), in a Raman shift spectrum measured through Raman spectroscopy.

4. The ceramic component of claim 1, wherein the ceramic component comprises a plurality of pores at the surface or in a section thereof and an average diameter of the plurality of pores is 5 μm or less.

5. The ceramic component of claim 1, wherein the ceramic component comprises:
a placing part having a first height from a reference plane; and
a main part having a second height from the reference plane,
wherein the placing part comprises an upper surface of the placing part where an etching target is placed, and the main part comprises an upper surface of the main part, which is directly etched by plasma.

6. The ceramic component of claim 5, wherein a gradient part is further comprised between the placing part and the main part, and the gradient part comprises an upper surface of the gradient part connecting the upper surface of the placing part and the upper surface of the main part.

7. The ceramic component of claim 1, wherein the ceramic component has a bending strength of 300 MPa or more.

8. The ceramic component of claim 1, wherein a total amount of the carbon-based material is 0.5 wt % or more based on a total weight of the ceramic component.

9. A ceramic component comprised in a plasma etching apparatus,
wherein a surface of the ceramic component comprises a base material and a composite material disposed in contact with the base material,
wherein a resistivity of the ceramic component is $10^{-2}$ $\Omega \cdot cm$ to $10^{-1}$ $\Omega \cdot cm$, and
wherein the base material comprises a first boron carbide-based material and the composite material comprises at least one selected from the group consisting of a second boron carbide-based material, boron oxide, and combinations thereof,
wherein the second boron carbide-based material of the composite has an $I_{ab}/I_{cd}$ ratio of 1 to 1.8, where a ratio of a sum ($I_{ab}$) of strengths of peaks near 481 $cm^{-1}$ ($I_a$) and strengths of peaks near 534 $cm^{-1}$ ($I_b$) to a sum ($I_{cd}$) of strengths of peaks near 270 $cm^{-1}$ ($I_c$) and strengths of peaks near 320 $cm^{-1}$ ($I_d$), in a Raman shift spectrum measured through Raman spectroscopy.

10. The ceramic component of claim 9, wherein a size of the composite material is 40 μm or less.

11. The ceramic component of claim 9, wherein the second boron carbide-based material of the composite has an $I_{ab}/I_{cd}$ ratio of 1.1 to 2.3, where a ratio of a sum ($I_{ab}$) of strengths of peaks near 481 $cm^{-1}$ ($I_a$) and strengths of peaks near 534 $cm^{-1}$ ($I_b$) to a sum ($I_{cd}$) of strengths of peaks near 270 $cm^{-1}$ ($I_c$) and strengths of peaks near 320 $cm^{-1}$ ($I_d$), in a Raman shift spectrum measured through Raman spectroscopy.

12. The ceramic component of claim 9, comprising
a placing part having a first height from a reference plane; and
a main part having a second height from the reference plane,
wherein the placing part comprises an upper surface of the placing part where an etching target is placed, and the main part comprises an upper surface of the main part, which is directly etched by plasma.

13. The ceramic component of claim 9, wherein the ceramic component has a bending strength of 300 MPa or more.

14. The ceramic component of claim 9, wherein the amount of the carbon-based material in the ceramic component is 0.5 wt % or more compared to a total weight of the ceramic component.

15. A method of manufacturing a ceramic component comprising:
preparing at least one raw material selected from the group consisting of a first raw material comprising boron carbide, a second raw material comprising boron carbide, boron oxide, and a carbon-based material, and a third raw material comprising boron carbide and a carbon-based material; and preparing the ceramic component by sintering and shaping machining the at least one raw material, wherein the preparing the at least one raw material comprises preparing raw material grains by slurrying and granulating the at least one raw material, wherein the at least one raw material after the slurrying has a zeta potential of +15 mV or more.

16. The method of claim 15, wherein a surface of the ceramic component comprises a base material and a composite material disposed in contact with the base material, wherein a resistivity of the ceramic component is $10^{-1}$ Ω·cm to 20 Ω·cm, and wherein the base material comprises a first boron carbide-based material and the composite material comprises at least one selected from the group consisting of a second boron carbide-based material, a carbon-based material, and combinations thereof, wherein the second boron carbide-based material of the composite material has an $I_{ab}/I_{cd}$ ratio of 1.0 to 1.8, where the $I_{ab}/I_{cd}$ ratio is a ratio of a sum ($I_{ab}$) of strengths of peaks near 481 cm$^{-1}$ ($I_a$) and strengths of peaks near 534 cm$^{-1}$ ($I_b$) to a sum ($I_{cd}$) of strengths of peaks near 270 cm$^{-1}$ ($I_c$) and strengths of peaks near 320 cm$^{-1}$ ($I_d$), in a Raman shift spectrum measured through Raman spectroscopy, wherein the carbon-based material of the composite material has an $I_e/I_f$ ratio of 0.2 to 2, where the $I_e/I_f$ ratio is a ratio of a strength of G band peak ($I_e$) to a strength of D band peak ($I_f$), in the Raman shift spectrum.

17. The method of claim 16, wherein a size of the composite material is 40 μm or less.

18. A plasma etching apparatus comprising the ceramic component of claim 1.

19. A plasma etching apparatus comprising the ceramic component of claim 9.

* * * * *